United States Patent [19]

Sano

[11] Patent Number: 4,942,058
[45] Date of Patent: Jul. 17, 1990

[54] PROCESS FOR FORMING DEPOSITED FILM

[75] Inventor: Masafumi Sano, Nagahama, Japan

[73] Assignee: Canon Kabushiki Kaisha, Tokyo, Japan

[21] Appl. No.: 363,309

[22] Filed: Jun. 8, 1989

Related U.S. Application Data

[63] Continuation of Ser. No. 183,484, Apr. 15, 1988, abandoned, which is a continuation of Ser. No. 38,710, Apr. 15, 1987, abandoned.

[30] Foreign Application Priority Data

Apr. 15, 1986 [JP] Japan .................. 61-086826

[51] Int. Cl.[5] .................. C23C 16/00; B05D 3/06
[52] U.S. Cl. .................. 427/431; 427/255.1; 427/301; 156/647; 156/662; 156/610; 156/612; 437/228
[58] Field of Search .......... 156/647, 648, 646, 657, 156/662, 610, 612; 437/228; 427/255.1, 255.2, 43.1, 301

[56] References Cited

U.S. PATENT DOCUMENTS

| | | | |
|---|---|---|---|
| 4,522,662 | 6/1985 | Bradbury et al. | 156/610 |
| 4,608,117 | 8/1986 | Ehrlich et al. | 156/610 |
| 4,773,964 | 9/1988 | Haond | 156/603 |
| 4,791,071 | 12/1988 | Ang | 437/42 |

FOREIGN PATENT DOCUMENTS

| | | | |
|---|---|---|---|
| 0087425 | 7/1980 | Japan | 156/610 |
| 3107260 | 9/1982 | Netherlands | 156/610 |

Primary Examiner—David L. Lacey
Assistant Examiner—Lou Ann Johnson
Attorney, Agent, or Firm—Fitzpatrick, Cella, Harper & Scinto

[57] ABSTRACT

A process for forming a crystalline deposited film on a substrate in a film forming space comprising (a) preparing the surface of the substrate by selectively irradiating the surface with an energy beam of an electromagnetic wave or an electron beam through an atmosphere of a gas to provide regions on which crystal nuclei are selectively formed, (b) forming the crystalline deposited film on the substrate surface by separately introducing an activated species (A) formed by decomposition of a compound (SX) containing silicon and a halogen and an activated species (B) formed from a chemical substance (B) for film formation, the activated species (B) being chemically mutually reactive with the activated species (A), the two activated species forming a mixture to effect a chemical reaction therebetween and thereby effecting the formation of the crystalline deposited film, and (c) exposing the crystalline deposited film surface to a gaseous substance (E) capable of effecting an etching action thereon and thereby effecting crystal growth in a specific face direction.

9 Claims, 2 Drawing Sheets

PROCESS FOR FORMING DEPOSITED FILM

This application is a continuation of application Ser. No. 183,484 filed Apr. 15, 1988, now abandoned, which, in turn, is a continuation of application Ser. No. 038,710, filed Apr. 15, 1987, now abandoned.

BACKGROUND OF THE INVENTION

1. Field of the Invention

This invention relates to a process suitable for forming a functional deposited film containing silicon, particularly a polycrystalline silicon deposited film for use in semiconductor devices, photosensitive device, line sensors for image input, image pick-up devices, etc.

2. Related Background Art

Heretofore, a process for forming a polycrystalline or monocrystalline semiconductor layer composed of coarse grains by exposing a polycrystalline or amorphous semiconductor layer on an insulating substrate to an energy beam has been proposed as prior art. For example, a polycrystalline or monocrystalline silicon layer composed of coarse grains can be formed by coating a silicon substrate with an insulating film of $SiO_2$ or SiN, depositing a polycrystalline layer thereon by CVD in reduced pressure or normal pressure or by plasma CVD, and subjecting the polycrystalline layer to annealing by irradiation of a continuous laser beam or electron beam. However, it is difficult to control crystal grain size, crystal grain size distribution, crystal grain site, etc. of polycrystalline silicon or crystal face orientation according to the prior art process. Therefore, in semiconductor devices where semiconductor elements are formed on a semiconductor substrate as described above, fluctuation and reliability in their characteristics have been thus problems. According to another prior art process, a polycrystalline layer composed of coarse grains or a monocrystalline layer is formed by forming regular grooves (gratings) on an insulating film surface, depositing a polycrystalline or amorphous silicon layer thereon, and annealing the layer (graphoepitaxial process). However, this process has a poor reproducibility and the crystal face orientation cannot be completely controlled. Thus, a novel process for, depositing a film free from these problems has been desired.

SUMMARY OF THE INVENTION

The primary object of the present invention is to provide a novel process for forming a polycrystalline silicon deposited film free from the problems of the prior art processes as described above and not based on the conventional process.

Another object of the present invention is to solve the said problems and provide a process for forming a deposited film by which a polycrystalline film of good quality and uniform crystal face orientation can be obtained.

Still another object of the present invention is to provide a process for forming a polycrystalline deposited film, which comprises selectively irradiating a substrate with an energy beam obtained by previously conversing energy such as an electromagnetic wave such as light, microwave, etc., and an electron beam etc. to limit the sites of crystal nucleation on the substrate, and effecting film formation while controlling crystal grain size of polycrystal.

Yet another object of the present invention is to provide a process for forming a polycrystalline deposited film which is suitable for enlargement of the area of the film and can easily accomplish improvement of productivity and bulk production of the film, while attempting to improve the characteristics of the film formed, the film forming speed and reproducibility and also to uniformize film quality.

According to the present invention, there is provided a process for forming a deposited film comprising the steps of:

(a) preparing a substrate for deposited film formation by selectively irradiating the surface of a base member with an energy beam of an electromagnetic wave or electron beam through atmosphere of a reactive gas or a gas having etching action to provide regions where crystal nuclei are selectively formed scatteringly on the surface;

(b) forming a deposited film on said substrate by introducing an activated species (A) formed by decomposition of a compound (SX) containing silicon and a halogen and an activated species (B) formed from a chemical substance (B) for film formation which is chemically mutually reactive with said activated species (A) separately from each other into a film forming space in which said substrate is previously arranged to effect chemical reaction therebetween; and (c) introducing into said film forming space during the film forming step (b) a gaseous substance (E) having etching action on the deposited film to be formed or a gaseous substance (E2) capable of forming the gaseous substance (E) and exposing the deposited film growth surface to the gaseous substance (E) to apply etching action on the deposited film growth surface, thereby effecting preferentially crystal growth in a specific face direction.

DESCRIPTION OF THE PREFERRED EMBODIMENT

Figure 1:
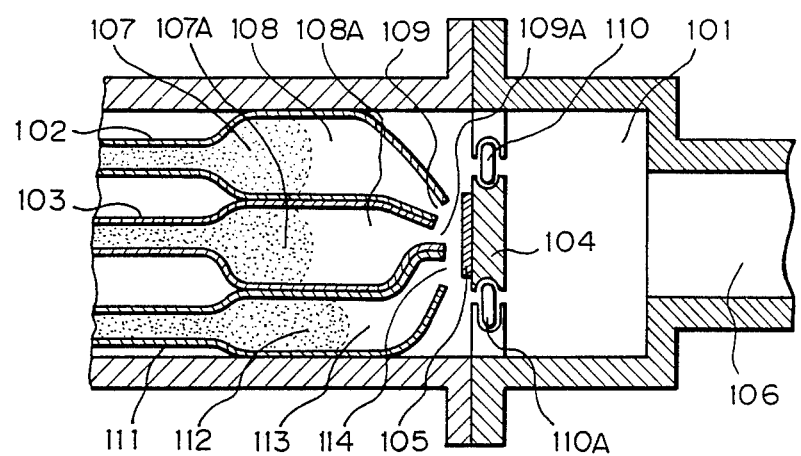
FIGS. 1 and 2 are each schematic views illustrating the main part of a deposited film forming device for embodying the process of the present invention.

At first, a procedure for selectively providing crystal nucleation regions (nucleation surface) on a substrate beforehand will be described below, and then a procedure capable of controlling the crystal face direction (orientation) and polycrystal grain size using the substrate will be described.

Crystal nucleation regions can be selectively formed on a substrate, for example, (i) by locally and spotwise irradiating the substrate with an energy beam of a convergent electromagnetic wave such as light, microwave, etc. or an electron beam, thereby locally forming a deposited film on the substrate, or (ii) by locally etching the substrate, thereby making the substrate surface irregular, or (iii) by locally and spotwise irradiating the substrate with an energy beam, thereby crystallizing parts of the substrate surface or (iv) effecting isomerization treatment of the substrate surface, thereby changing the adsorption characteristics or chemical activity of the substrate surface; that is, providing locally a surface-energetic or physical localization on the substrate. Specifically, as the above process (i), there is mentioned, for example, a process comprising irradiating a substrate locally and spotwise through reactive gases with an energy beam obtained by converging an electromagnetic wave such as light, microwave, etc. or an electron beam to locally deposit a deposit film onto the substrate. As the above process (ii), there is mentioned, for example, a process in which the substrate surface is locally made irregular by using a reactive etching gas in place of reactive gases, or a process in which a positive type resist is applied to the substrate and the substrate is exposed locally to an energy beam to make the substrate surface irregular. As the above processes (iii) and (iv), there is mentioned, for example, a process in which an amorphous thin film is deposited on a substrate by a known method, for example, by RF glow discharge, vacuum vapor deposition, sputtering or light CVD beforehand, and then the substrate is exposed locally to an energy beam to effect crystallization or isomerization, or a process in which a thin film of an organic compound is deposited on a substrate by interfacial adsorption such as by monomolecular layer buildup (LB method), gaseous phase adsorption, liquid phase adsorption, etc. or by electrolytic polymerization, vapor deposition or sputtering, and then the substrate is exposed locally to the energy beam to effect isomerization or crystallization. Or a substrate of polymeric material is exposed locally to an energy beam to effect isomerization to form nucleation regions.

Next, process for forming a film while controlling the orientation, grain size and grain size distribution of the crystal by using a substrate having crystal nucleation regions provided selectively thereon according to the above processes will be described below.

In the present invention, as a first step, a substrate having a nucleation surface provided selectively on the surface thereof is previously arranged in a film forming space for formation of a deposited film [Step (a)].

Next, an activated species (A) formed by decomposition of a compound (SX) containing silicon and a halogen and an activated species (B) formed from a chemical substance (B) for film formation which is chemically mutually reactive with the activated species (A) are introduced separately from each other into the film forming space to effect chemical reaction therebetween, thereby forming a deposited film on the substrate [Film forming Step (b)].

During the film forming step (b), a gaseous substance (E) having etching action on the deposited film to be formed or a gaseous substance (E2) capable of forming the gaseous substance (E) are introduced into the film forming space and the deposited film growth surface is exposed to the gaseous substance (E) to apply etching action on the deposited film growth surface, thereby effecting preferentially crystal growth in a specific face direction [Step (c)].

As described above, by providing the above steps (a)-(c) film formation can be effected while desirably controlling the orientation, crystal grain size and grain size distribution and exhibiting the technical advantage as described below.

The technical advantage accomplished according to the process of the present invention is that the deposited film formed in the copresence of an active species (A) formed by decomposition of a compound containing silicon and halogen and another species (B) formed from a chemical substance for forming a film in a film-forming space in place of generating a plasma is insusceptible to adverse effects of the plasma.

Another advantage of the present invention is that a stable CVD process can be provided since the atmosphere temperature of the film forming space and the substrate temperature can be desirably controlled.

Still another advantage of the present process is accomplished by use of an active species previously activated in a different activation space from the film-forming space. That is the film-forming speed can be made drastically higher and the substrate temperature for forming a deposit film can be made much lower than the conventional CVD process while film characteristic of good quality can be obtained. Furthermore, there can be mentioned the advantage that a crystalline film can be formed having a specific crystal face orientation, that is, a film of good quality with a specific orientation of high degree and uniform grain size by the etching effect of the gaseous material (E) having etching action.

The compound (SX) containing silicon and halogen to be introduced into the activation space (A) in the present invention, includes for example, linear or cyclic silane compounds, part or whole of whose hydrogen atoms are substituted with halogen atoms, are used. Specifically, linear silicon halides represented by $Si_uY_{2u+2}$, where u is an integer of 1 or more, Y is at least one element selected from F, Cl, Br and I, cyclic silicon halides represented by $Si_vY_{2v}$, where v is an integer of 3 or more and Y has the same meaning as defined above, and linear or cyclic compounds represented by $Si_uH_xY_y$, where u and Y have the same meaning as defined above and $x+y=2u$ or $2u+2$. More specifically, gaseous or readily gasified compounds such as $SiF_4$, $(SiF_2)_5$, $(SiF_2)_6$, $(SiF_2)_4$, $Si_2F_6$, $Si_3F_8$, $SiHF_3$, $SiH_2F_2$, $SiCl_4$, $(SiCl_2)_5$, $SiBr_4$, $(SiBr_2)_5$, $Si_2Cl_6$, $Si_2Br_6$, $SiHCl_3$, $SiH_3Cl$, $SiH_2Cl_2$, $SiHBr_3$, $SiHCl_3$, $Si_2Cl_3F_3$, etc. can be enumerated.

In order to form an active species (A), silicon simple substance and other silicon compounds, hydrogen, halogen compounds (for example, $F_2$ gas, $Cl_2$ gas, gasified $Br_2, I_2$, etc.), etc. can be used together, if necessary, in addition to the compound containing silicon and halogen (SX).

In the present invention, the active species (A) is formed in the activation space (A) by an activation energy such as an electric energy, for example, microwave, RF, low frequency wave, DC, etc., a thermal energy such as heater heating, infrared heating, etc., a photo energy, etc. in view of various given conditions and apparatuses.

As the chemical substance for forming a film to form the active species (B) in the activation space (B) hydrogen gas and/or a halogen compound (for example, $F_2$ gas, $Cl_2$ gas, gasified $Br_2, I_2$, etc.) can be advantageously used. In addition to the chemical substance for forming a film, an inert gas such as helium, argon, neon, etc. can be used. When a plurality of these chemical substances for forming a film are used, they can be introduced in a gaseous state into the activation space (B) after mixing them in advance, or these chemical substances for forming a film can be separately introduced into the activation space (B) from their independent supply sources, or introduced into the respective, independent activation spaces to make individual activations.

In the present invention, a mixing ratio of the active species (A) to the active species (B) to be introduced into the film forming space is determined, as desired, in view of the film-forming conditions, kinds of the active species, etc., and is preferably 10:1 to 1:10 (introducing flow rate ratio), more preferably 8:2 to 4:6.

Also, the deposited film formed according to the present invention can be doped with the so-called impurity element used in the field of semiconductor during or after film formation. As the impurity element to be used, there may be employed, as p-type impurity, an element belonging to the group IIIA of the periodic table such as B, Al, Ga, In, Tl, etc. and, as n-type purity, an element belonging to the group VA of the periodic table such as P, As, Sb, Bi, etc. as suitable ones. Particularly, B, Ga, P and Sb are most preferred. The amount of the impurity to be doped may be determined suitably depending on the desired electrical and optical characteristics.

As the substance containing such an impurity atom as the component (substance for introduction of impurity), it is preferably to select a compound which is gaseous under normal temperature and normal pressure, or gaseous at least under the activation conditions film and can be readily gasified by a suitable gasifying device. Such compounds may include $PH_3$, $P_2H_4$, $PF_3$, $PF_5$, $PCl_3$, $AsH_3$, $AsF_3$, $AsF_5$, $AsCl_3$, $SbH_3$, $SbF_5$, $SiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$, etc. The compounds containing impurity element may be used either singly or as a combination of two or more compounds.

The compound containing impurities as element may be directly introduced under gaseous state into the film forming space, or alternatively activated previously in the activation space (A) or the activation space (B) or a third activation space (C) before introduction into the film forming space.

In the present invention, during the film forming step (a), that is (A) during film formation etching action is applied on the growth surface of the deposited film at the same time, or (B) etching action is applied on the growth surface of the deposited film with film formation intermitted, whereby crystal growth can be effected preferentially in a specific face direction to give a deposited film with good crystallinity. The etching action in the case of the above (B) may be effected within the film forming space or alternatively in an etching space separate from the film forming space.

As the gaseous or readily gasifiable substance for etching (E) having etching action on the deposited film containing silicon, there may be included single substances of halogen, halogen compounds or activated species (C) formed from these.

These substances (E) for etching may be introduced under gaseous state into the space where etching action is applied to the deposited film, or alternatively in the case where the substance (E) is formed by the surface reaction on the surface of the deposited film of the above activated species (A) or the above activated species (B), or formed from the chemical reaction between the activated species (A) and the activated species (B), etching action is applied on the growth surface of the deposited film simultaneously with film formation.

For example, as an example in which the substance for etching is formed by the above surface reaction, the reaction between an activated species of halogen and hydrogen or a halogen and activated species of hydrogen occurs on the growth surface of the deposited film, and hydrogen halide (HX) is released from the growth surface of the deposited film and the hydrogen halide becomes the substance (E) for etching.

As the substance (E) having etching action in the present invention, there may be employed halogens such as $F_2$, $Cl_2$, gasified $Br_2$, $I_2$, etc., halogenated carbon such as $CHF_3$, $CF_4$, $C_2F_6$, $CCl_4$, $CBrF_3$, $CCl_2F_2$, $CCl_3F$, $CClF_3$, $C_2Cl_2F_4$, etc., halides including typically boron halides such as $BCl_3$, $BF_3$ and $SF_6$, $NF_3$, $PF_5$, etc., and further radicals such as F*, Cl*, ions such as $CF_3$*, $CCl_3$*, from these gases. These can be used also as mixtures, and the etching characteristics can be also controlled by adding $O_2$, $H_2$ and other gases in amounts which do not affect the film.

As the method for etching using the above substance (E), etching and film formation may be repeated alternately by providing separately an etching space, or they can be introduced under the state having etching activity into the film forming space to effect etching action simultaneously with film formation, thereby giving the effect of limiting the growing direction of the crystalline film to accomplish the object of the present invention.

On the other hand, the dependency of growth speed upon face direction has been found during crystal growth of silicon or silicon-containing materials. This may differ depending on the deposited film forming method or deposition conditions, but in the method of the present invention, the preferential order has been found to be (110)>(111)>(100). By suitable selection of the kind of substance (E) for etching and etching condition under this condition, the condition with stronger orientability of (110)>>(111)>>(100) can be realized. It is realized in the present invention to strengthen the above orientability and accelerate the growth speed, particularly by setting a portion for accelerating nucleation on the substrate. And, not only formation of polycrystalline deposited film with great grain size oriented only toward the (110) face is possible, but it is also possible to grow a single crystal by selecting the size, shape, interval, material, etc., of the nucleus.

In the present invention, the expression crystalline deposited film of course represents a polycrystalline and a single crystal film. The nucleation surface provided on the substrate surface in the present invention are provided scatteringly in large number. As the property demanded for the nucleation surface, it may be mentioned that the active species (A) in the vicinity of the substrate formed from compounds containing silicon and a halogen has a great coefficient of attachment. In order to enhance the coefficient of attachment, a material having a large coefficient of attachment may be employed or a surface structure for enhancing the coefficient of attachment may be formed. Coefficient of attachment generally refers to a quantity which is a measure for readiness in chemical adsorption to occur, and in the case of the present invention, physical adsorption and chemical adsorption including dissociation are also included. As the surface structure enhancing the coefficient of attachment, those with surface unevenness of some 1000 Å or less are preferred. As to the shape, those with shapes as regular as possible rather than random are preferred.

The material having a large coefficient of attachment may be selected from among insulating substances and semiconductive substances such as Si:N:H, $Si_3N_4$, A-Si:H, Si:N:O:H, $Al_2O_3$, $SiO_2$, $Ta_2O_5$, etc., but particularly a compound containing Si-N is preferred. Also, a metal material may be sometimes employed. As mentioned above, the order of stronger orientability of crystal has been made as (110)>(111)>(100), but of course it is possible in the present invention to control the direction of oriented surface and the direction of the crystal growth face depending on the conditions of deposition and nucleation.

The nucleation surface of the present invention does not have to be uniformly spread continuously over the whole substrate surface, but a film with regular sized crystal grains and regular crystal axis directions may be obtained by locally providing the nucleation surface scatteringly while determining its area depending on the purposes.

FIG. 1 is a schematic sectional view illustrating the main part of an apparatus for forming a deposited film for embodying the present process. In FIG. 1, numeral 101 is a deposition compartment where deposition of a silicon thin film is effected, and the deposition compartment 101 is connected to an exhausting system, not shown on the drawing, through a vent 106 to maintain the deposition compartment under a desired pressure. In the deposition compartment 101, an inlet pipe 102 for introducing a radical 107 containing Si and halogen as an activated species (A), an inlet pipe 103 for introducing a hydrogen radical 107A as an activated species (8) and an inlet pipe 111 for introducing $F_2$ gas 112 as a gaseous substance (E) having etching action are enlarged to form action compartments 108, 108A and 113, respectively, and are narrowed at the outlet ends 109, 109A and 114, respectively. In the deposition compartment 101, a substrate support 104 is supported by rollers 110 and 110A so that the substrate support 104 can reciprocatingly moved in a direction perpendicular to the drawing surface, and the substrate 105 for deposition on which nucleation surface has been previously provided is supported on the substrate support 104. The respective radicals and $F_2$ gas discharged at the outlet ends 109, 109A and 114 are mixed together near the substrate in the deposition compartment 101 to undergo reaction therebetween and form a deposited film on the substrate 105 while being etched.

The radicals containing silicon and halogen and the hydrogen radicals are formed from their starting material gases in heating furnaces or radical-forming sections in plasma chambers, etc., not shown in the drawing, respectively, and then introduced into the action compartments 108 and 108A through the inlet pipes 102 and 103, respectively. The flow rates of the radicals are controlled by mass flow controllers provided at positions towards the gas sources from the heating furnaces or plasma chambers, respectively. When the substrate 105 is longer in the direction perpendicular to the drawing surface, the substrate 105 is made to move by means of the rollers 110 and 110A in order to deposit a silicon thin film on the entire surface of the substrate.

EXAMPLE 1

Figure 2:
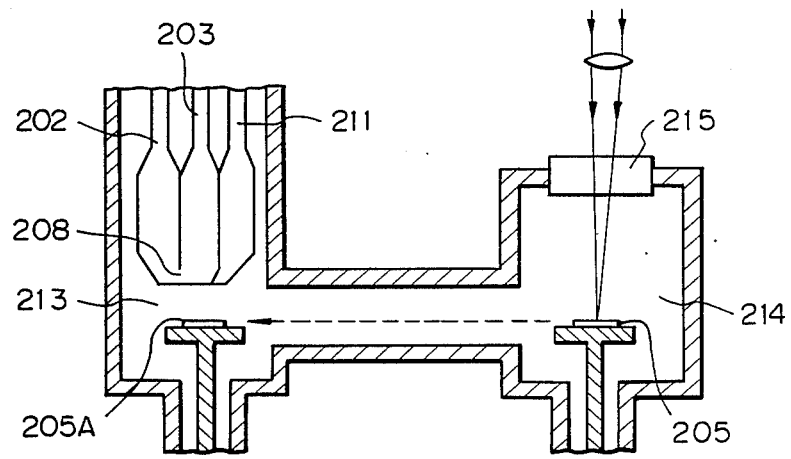
Figure 3:
FIGS. 3, 4 and 6 are each schematic views illustrating the substrate for deposited film formation used in Examples.

In an apparatus shown in FIG. 2 having the apparatus in the part which has the same structure as shown in FIG. 1, a glass substrate 205 was placed on a structure holder in a structure pretreatment compartment 214, and exposed through a quartz window 215 to ArF excimer laser having a wavelength of 193 nm and a pulse width of 20 n sec after focussed to a laser spot having a spot size of about 10 $\mu$m through an optical system at 8 W/cm$^2$ and 80 pulses, while keeping the glass substrate 205 at 250° C., and passing 50 sccm of $Si_2H_6$ under a pressure of 5 Torr as a reactive gas, whereby amorphous silicon films area 302 where formed at distances of 1 $\mu$m (FIG. 3) on the glass state 205. Further, the glass substrate 205 is shown as 301 in FIG. 3. The substrate 205A whose nucleation formation surface was thus prepared scatteringly on the surface in advance was transferred into a reaction compartment 213 form the nucleation compartment 214 to form a polycrystalline film on the said substrate 205A as follows.

First, $SiF_4$ gas as a raw material gas for forming radicals containing silicon and halogen was introduced into a reaction furnace kept at 1,100° C., and decomposed, and then discharged into a reaction compartment 208 from an inlet pipe 202, while $H_2$ gas was introduced into an inlet pipe 203. At this time, decomposed by supplying a microwave of 2.45 GHz at a power of 0.8 W/cm$^2$ to the inlet pipe 203 to form hydrogen radical and the said radicals were discharged into the reaction compartment 208. Furthermore, $XeF_2$ as an etching gas was supplied towards the substrate 205A from an inlet pipe 211 at the same time. The substrate was kept at a temperature of 300° C. A ratio of flow rate (sccm) of $XeF_2$ gas to flow rate (sccm) of $SiF_4$ was changed to 5/100, 10/100, 15/100, 20/100, and 30/100, each kept under a pressure of 0.5 Torr for one hour to form films. As a result, films having the characterisitcs shown in Table 1 were deposited. Grain sizes were measured by a transmission type electron microscope. Among the samples, the mobility values of sample No. 3 having the best mobility measurement values is shown in Table 2. For comparison, measurement values of sample R in which the polycrystalline Si film formed on a glass substrate having no treatment of formation of nucleation surface as sample No. 3 is shown in Table 2. It is evident from Table 2 that the present invention can provide films of good characteristics, i.e. good orientation and less fluctuation.

EXAMPLE 2

3 sccm of $Si_2H_6$ and 100 sccm of $NH_3$ were used as reactive gases, but under a pressure of 10 Torr to form amorphous silicon nitride films spotwise on the glass substrate, and then a polycrystalline film was deposited thereon in the same manner as Sample 3 in Example 1.

And, the result were evaluated as the same as in Example 1. The results are shown in Tables 2 and 3.

EXAMPLE 3

In formation of the nucleation surface, except amorphous silicon nitride films were formed spotwise on the glass substrate with flowing 200 sccm of $NH_3$ as a reactive gas, and under a pressure of 50 Torr, polycrystalline Si film was deposited on the glass substrate in the same conditions as Sample 3 in Example 1 and the characteristics were evaluated in a similar manner as Example 1. The results are shown in Table 3 (sample No. 3-1)

EXAMPLE 4

After amorphous silicon films were deposited on the glass substrate spotwise under the same conditions as in Example 1, then spotwise crystallized silicon films was further obtained by applying ArF excimer laser on the above-mentioned amorphous silicon film.

A polycrystalline Si film was deposited thereon at the same condition as in sample No. 3 in Example 1 and the characteristics were evaluated in the same manner as in Example 1 (sample 4-1). The results are shown in Tables 2 and 3.

EXAMPLE 5

Figure 4:

Except reactive etching gas $F_2$ was used for forming nucleation surface to etch a glass substrate spotwise under a pressure of 5 Torr, the substrate 401 for formation of deposited film having the structure such as shown in FIG. 4 is formed. Using this substrate 401, the polycrystalline Si film was deposited and the characteristics thereof were evaluated in the same manner as Example 1 (Sample 5-1). The results are shown in Tables 2 and 3.

EXAMPLE 6

Figure 5:
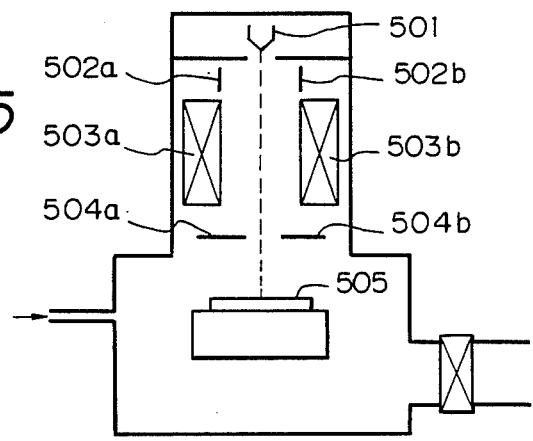
FIG. 5 is a schematic illustration of the main part of the electron beam irradiating device which is a substrate preparing device used in Example.
Figure 6:
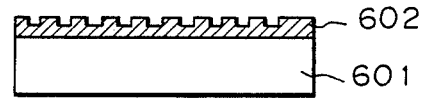

A glass plate 505 (#7059, made by Corning Glass Works) prebacked after spinner coating of polymethyl methacrylate (P-MMA) as a positive type resist was placed in an electron beam irradiation apparatus as shown in FIG. 5, and then subjected to electron beam irradiation on the resist film as follows. Electrons emitted from an electron gun 501 were irradiated on the glass substrate. As an accelerated convergent electron beam through deflection electrodes 503a and 503b and control electrodes 502a and 502b as well as 504(a) and 504(b). The electron beam at this time had 3 mA of a beam current at 5 KeV of an acceleration voltage. The electron beam was irradiated on the resist film of abovementioned glass substrate 505 spotwise having a diameter of 0.1 μm at intervals of 0.1 μm. There were $10^{-5}$ Torr of vacuum at this time. Thus, the substrate having a structure as shown in FIG. 6 for forming the deposited film (the glass substrate 505 is shown a 601 and the resist film prepared unevenness on the surface is shown as 602) was prepared. The polycrystalline film was deposited on this substrate at the same condition as Sample No. 3 in Example 1 (sample 5-1). About this sample, the characteristics were evaluated in the same manner as Example 1. The results are shown in Tables 2 and 3.

EXAMPLE 7

An amourphous silicon thin film was formed on a glass substrate by RF glow discharge. Except setting the laser pulse number for 150 and without using the reactive glass, local annealing was done by irradiating the laser on this amorphous silicon thin film on the glass substrate in the same manner as in Example 1, being crystallized locally. Then, a polycrystalline film was deposited on the thus obtained substrate for formation of the deposited film under the same conditions as in Sample No. 3 (sample 7-1). Characteristics of the sample was obtained in the same manner as in Example 1. The results are shown in Tables 2 and 3.

EXAMPLE 8

A film consisting of 11 diacetylene layers was deposited on a glass substrate (#7059, made by corning Glass Works) according to LB method in the following manner. That is, a glass substrate was at first washed with ultrapure water to remove oily matters therefrom, and then dipped into water. Then, a few drops of a solution of diacetylene in chloroform at a concentration of $5 \times 10^{-3}$ mol/l was added thereto, and after a given pressure was applied to the liquid surface. Then, the glass substrate was vertically reciprocated at a speed of 1 cm/min while maintaining the pressure to deposit a film consisting of 11 layers. Then, the film was exposed to a focussed UV light (254 nm) at a power of 10 $mW/cm^2$ to effect local polymerization. So, characteristics for formation of deposited film formed.

Using this substrate, a polycrystalline Si was prepared in the same manner as in Sample No. 3 (Sample No. 8-1). The characteristics were evaluated in the same as in Example 1. The results are shown in Tables 2 and 3.

TABLE 1

| Sample No. | 1 | 2 | 3 | 4 | 5 |
|---|---|---|---|---|---|
| $XeF_2$ gas flow rate (SCCM)/$SiF_4$ gas flow rate (SCCM) | 5/100 | 10/100 | 15/100 | 20/100 | 30/100 |
| Peak intensity ratio in diffraction of 220/111 by X-ray | 15/0 | 43/0 | 75/20 | 75/25 | 0/0 |
| Grain size (Å) | 90 | 1300 | 2500 | 600 | 0 |
| Deposition rate (Å/sec) | 7.0 | 11.5 | 4.1 | 2.2 | 1.2 |

TABLE 2

| Sample No. | Arbitrary measurement sites [$cm^2/V \cdot sec$] | | | | | Fluctuation |
|---|---|---|---|---|---|---|
| | Point A | Point B | Point C | Point D | Point E | |
| R | 13 | 7 | 10 | 19 | 16 | 13 ± 46% |
| 3 | 79 | 80 | 81 | 80 | 80 | 80 ± 1% |
| 2-1 | 100 | 100 | 100 | 100 | 100 | 100 ± 0% |
| 3-1 | 65 | 65 | 65 | 66 | 64 | 65 ± 2% |
| 4-1 | 120 | 120 | 120 | 120 | 120 | 120 ± 0% |
| 5-1 | 67 | 68 | 68 | 68 | 69 | 68 ± 2% |
| 6-1 | 42 | 42 | 41 | 43 | 42 | 42 ± 2% |
| 7-1 | 55 | 56 | 55 | 54 | 55 | 55 ± 2% |
| 8-1 | 48 | 48 | 47 | 48 | 49 | 48 ± 2% |

TABLE 3

| | Sample No. | | | | | | |
|---|---|---|---|---|---|---|---|
| | 2-1 | 3-1 | 4-1 | 5-1 | 6-1 | 7-1 | 8-1 |
| $XeF_2$ gas flow rate (SCCM)/$SiF_4$ gas flow rate (SCCM) | 15/100 | 15/100 | 15/100 | 15/100 | 15/100 | 15/100 | 15/100 |
| Peak intensity ratio in diffraction of 220/111 by X-ray | 95/0 | 85/5 | 100/0 | 80/10 | 75/15 | 85/10 | 80/10 |
| Grain size (Å) | 9000 | 600 | 10,000 | 350 | 2700 | 450 | 350 |
| Deposition rate (Å/sec) | 8.0 | 6.0 | 9.0 | 5.0 | 4.5 | 5.6 | 5.0 |

I claim:

1. A process for forming a crystalline deposited film on a substrate surface in a film forming space, comprising the steps of:
   (a) preparing the surface of said substrate by selectively irradiating the surface thereof with an energy beam of an electromagnetic wave or electron beam through an atmosphere of a gas to provide regions on which crystal nuclei are selectively formed;

(b) forming said crystalline deposited film on said surface of said substrate by separately introducing an activated species (A) formed by decomposition of a compound (SX) containing silicon and a halogen and an activated species (B) formed from a chemical substance (B) for film formation which is chemically mutually reactive with said activated species (A) to form a mixture and effect a chemical reaction therebetween to thereby effect the formation of the crystalline deposited film, said crystalline deposited film having a surface; and (c) producing an etching action on the crystalline deposited film by exposing the crystalline deposited film surface to a gaseous substance (E) capable of effecting an etching action thereon, and thereby effecting crystal growth in a specific face direction.

2. A process for forming deposited film according to claim 1, wherein said compound (SX) is a chain halogenated silicon represented by the formula $Si_uY_{2u+2}$ (wherein u is an integer of 1 or more, Y is at least one element selected from F, Cl, Br and I).

3. A process for forming deposited film according to claim 1, wherein said compound (SX) is a chain or cyclic halogenated silicon represented by the formula $Si_uH_xY_y$ (wherein u, x, y are integers of 1 or more, $x+y=2u$ or $x+y=2u+2$, and Y is at least one element selected from F, Cl, Br and I).

4. A process for forming deposited film according to claim 1, wherein either one of hydrogen and halogen is used in addition to said compound (SX) during decomposition of said compound (SX).

5. A process for forming deposited film according to claim 1, wherein said chemical substance (B) for film formation is either one of hydrogen gas and halogen gas.

6. A process for forming deposited film according to claim 1, wherein the flow rate ratio of said active species (A) and said active species (B) when introduced into the film-forming space is 10:1 to 1:10.

7. A process for forming deposited film according to claim 1, wherein a compound containing an impurity element as the component is permitted to coexist with said compound (SX) during formation of said activated species (A).

8. A process for forming deposited film according to claim 1, wherein a compound containing an impurity element as the component is permitted to coexist with said chemical substance (B) for film formation during formation of said activated species (B).

9. A process for forming deposited film according to claim 1, wherein an activated species (D) formed from a compound containing an impurity element as the component is introduced into said film-forming space.

* * * * *

UNITED STATES PATENT AND TRADEMARK OFFICE
CERTIFICATE OF CORRECTION

PATENT NO. : 4,942,058

DATED : July 17, 1990

INVENTOR(S) : MASAFUMI SANO

It is certified that error appears in the above-identified patent and that said Letters Patent is hereby corrected as shown below:

ON THE TITLE PAGE:
IN [56] REFERENCES CITED

FOREIGN PATENT DOCUMENTS, "Netherlands" should read --Fed. Rep. of Germany--.

COLUMN 1

Line 44, "for," should read --for--.
    Line 62, "conversing" should read --converging--.

COLUMN 2

Line 45, "Example." should read --Examples.--.

COLUMN 3

Line 6, "deposit" (second occurrence) should read --deposited--.
    Line 59, "(a)-(c) film" should read --(a)-(c), film--.

COLUMN 4

Line 10, "is the" should read --is, the--.
    Line 52, "(B) hydro-" should read --(B), hydro- --.

COLUMN 5

Line 18, "preferably" should read --preferable--.

UNITED STATES PATENT AND TRADEMARK OFFICE
CERTIFICATE OF CORRECTION

PATENT NO. : 4,942,058

DATED : July 17, 1990

INVENTOR(S) : MASAFUMI SANO

It is certified that error appears in the above-identified patent and that said Letters Patent is hereby corrected as shown below:

COLUMN 6

Line 8, "$CF_3^*$, $CCl_3^*$," should read --$CF_3^+$, $CCl_3^+$,--.
    Line 64, "Si:N:O:H," should read --Si:N:O:H,--.

COLUMN 7

Line 23, "activated species (8)" should read --activated species (B)--.
    Line 31, "moved" should read --be moved--.
    Line 62, "focussed" should read --being focussed--.
    Line 67, "where" should read --were--.
    Line 68, "glass state 205." should read --glass substrate 205.--.

COLUMN 8

Line 4, "form" should read --from--.
    Line 24, "characterisitcs" should read --characteristics--.
    Line 44, "result" should read --results--.

COLUMN 9

Line 15, "prebacked" should read --prebaked--.
    Line 21, "substrate. As" should read --substrate by--.
    Line 31, "a 601" should read --as 601--.
    Line 40, "amourphous" should read --amorphous--.
    Line 67, "was" should read --were--.

UNITED STATES PATENT AND TRADEMARK OFFICE
CERTIFICATE OF CORRECTION

PATENT NO. : 4,942,058
DATED : July 17, 1990
INVENTOR(S) : MASAFUMI SANO

It is certified that error appears in the above-identified patent and that said Letters Patent is hereby corrected as shown below:

COLUMN 10

Line 4, "corning" should read --Corning--.

COLUMN 11

Line 24, "more, Y" should read --more, and Y--.

COLUMN 12

Line 12, "active" should read --activated--.
    Line 13, "active" should read --activated--.

Signed and Sealed this

Twenty-ninth Day of September, 1992

Attest:

DOUGLAS B. COMER

Attesting Officer     Acting Commissioner of Patents and Trademarks